US010530346B2

(12) United States Patent
Mattia et al.

(10) Patent No.: US 10,530,346 B2
(45) Date of Patent: Jan. 7, 2020

(54) COMPARATOR CIRCUIT

(71) Applicants: IMEC VZW, Leuven (BE); Vrije Universiteit Brussel, Brussels (BE)

(72) Inventors: Oscar Elisio Mattia, Leuven (BE); Davide Guermandi, Heverlee (BE)

(73) Assignees: IMEC VZW, Leuven (BE); VRIJE UNIVERSITEIT BRUSSEL, Brussels (BE)

( * ) Notice: Subject to any disclaimer, the term of this patent is extended or adjusted under 35 U.S.C. 154(b) by 0 days.

(21) Appl. No.: 16/394,397

(22) Filed: Apr. 25, 2019

(65) Prior Publication Data
US 2019/0334510 A1   Oct. 31, 2019

(30) Foreign Application Priority Data

Apr. 27, 2018  (EP) ..................................... 18169851

(51) Int. Cl.
*H03K 3/3565*   (2006.01)
*H03K 3/011*    (2006.01)

(52) U.S. Cl.
CPC ........... *H03K 3/3565* (2013.01); *H03K 3/011* (2013.01)

(58) Field of Classification Search
CPC .............................. H03K 3/3565; H03K 3/011
USPC ....................................................... 327/205
See application file for complete search history.

(56) References Cited

U.S. PATENT DOCUMENTS

| 6,084,538 | A | 7/2000 | Kostelnik et al. |
| 6,087,873 | A | 7/2000 | Alexander |
| 6,316,978 | B1 | 11/2001 | Shacter |
| 9,654,086 | B1 | 5/2017 | Fifield et al. |
| 2009/0027086 | A1 | 1/2009 | Trifonov |
| 2015/0194950 | A1* | 7/2015 | Mahendra ........ H03K 3/356078 327/202 |
| 2015/0358006 | A1 | 12/2015 | Chen |

OTHER PUBLICATIONS

European Search Report, European Patent Application No. 18169851.5, dated Nov. 15, 2018, 8 pages.

* cited by examiner

*Primary Examiner* — Tomi Skibinski
(74) *Attorney, Agent, or Firm* — McDonnell Boehnen Hulbert & Berghoff LLP

(57) ABSTRACT

An aspect of the disclosure includes a comparator circuit comprising: a master latch comprising a first amplifier circuit and a first latch circuit coupled to an output of the first amplifier circuit; a slave latch comprising a second amplifier circuit having an input coupled to the output of the first amplifier circuit, and a second latch circuit coupled to an output of the second amplifier circuit; and a hysteresis compensation circuit coupled to the output of the second amplifier circuit and configured to cause a first predetermined signal level shift of an output signal of the first amplifier circuit in response to a high signal level at the output of the second amplifier circuit, and configured to cause a second predetermined signal level shift of an output signal of the first amplifier circuit in response to a low signal level at the output of the second amplifier circuit.

16 Claims, 4 Drawing Sheets

COMPARATOR CIRCUIT

CROSS-REFERENCE TO RELATED APPLICATIONS

The present application is a non-provisional patent application claiming priority to European Patent Application No. 18169851.5, filed on Apr. 27, 2018, the contents of which are hereby incorporated by reference.

FIELD OF THE DISCLOSURE

The present disclosure is related to a comparator circuit.

BACKGROUND

High-speed comparators are used in modern high-speed electronics, for instance in analog-to-digital converters (ADC). Two types of comparators commonly used in high speed applications are dynamic comparators and static comparators. Dynamic comparators can offer an advantage of no static power consumption and no hysteresis, due to a reset phase after the comparison. However, dynamic comparators can also have disadvantages such as high kick-back noise and high sensitivity to process, supply voltage, and temperature (PVT) variations. Meanwhile, static comparators may be realized with a comparably small number of transistors, provide inductive peaking possibilities, generally do not suffer from kick-back noise issues and are comparably robust against PVT variations. Static comparators can be employed in extremely high-speed applications, for instance in flash ADCs. However, static comparators have static power consumption.

FIG. 1 shows a static comparator 1 with schematically indicated master and slave latches 2, 3. The master latch 2 comprises, as shown in the enlargement, an amplifier circuit 4 in the form of a differential pair, and an associated latch circuit 5. The amplifier circuit 4 and the latch circuit 5 may, as shown, be alternatingly coupled to a current sink 6 (or alternatively to ground through a high resistance) in accordance with complementary clock signals CLK, CLK~. The slave unit 3 has a corresponding configuration. The static comparator 1 may as shown further comprise a programmable offset compensation current source 7 with a sign controlled by complementary static inputs SIGN, SIGN~ that determine the sign of the offset correction to be applied.

SUMMARY

Although static comparators can provide benefits in terms of speed compared to dynamic comparators, they generally present a drawback in relation to dynamic comparators in that they may exhibit significant hysteresis. Dynamic comparators may implement a reset phase after each comparison, whereby hysteresis may be avoided. However, implementing hysteresis compensation in a static comparator by adding a reset phase would decrease the effective time available for comparison, for the same clock frequency.

Embodiments of the disclosure can help address this issue. Embodiments of the disclosure can provide a comparator design for static operation, enabling compensation for hysteresis.

Embodiments of the disclosure include a comparator circuit comprising:

a master latch comprising a first amplifier circuit and a first latch circuit coupled to an output of the first amplifier circuit;

a slave latch comprising a second amplifier circuit having an input coupled to the output of the first amplifier circuit, and a second latch circuit coupled to an output of the second amplifier circuit; and a hysteresis compensation circuit coupled to the output of the second amplifier circuit and configured to cause a first predetermined signal level shift of an output signal of the first amplifier circuit in response to a high signal level at the output of the second amplifier circuit, and configured to cause a second predetermined signal level shift of an output signal of the first amplifier circuit in response to a low signal level at the output of the second amplifier circuit.

Embodiments of the comparator circuit can enable compensation for hysteresis present in the comparator circuit.

Hysteresis in a comparator implies different thresholds for high-to-low and low-to-high transitions of the comparator input signal. Hysteresis may degrade the performance of the comparator in terms of decision robustness and jitter. Hysteresis may in turn produce ripple effects in other parts of a signal-chain including the comparator. Illustrative examples include reduced receiver sensitivity, increased bit error rates (BER) of serial links, or degraded linearity performance in ADCs.

By means of the addition of the hysteresis compensation circuit, a feedback loop is provided which can enable a compensation to be applied at the output of the first amplifier circuit of the master latch (which forms an internal node between the master and slave latch). The compensation is responsive to whether the signal level at the output of the slave comparator is a high or low signal level. As used herein, the terminology "high signal level" and "low signal level" refer to a high logic level and a low logic level, respectively. A synonymous terminology is "first (logic) signal level" and "second (logic) signal level", wherein the first signal level is greater than the second signal level.

The hysteresis compensation circuit may be configured to minimize or at least reduce a magnitude of the input hysteresis of the comparator circuit. More specifically, the hysteresis compensation circuit may be configured to minimize or at least reduce a difference between a first threshold of the comparator and a second threshold of the comparator, the first threshold being in response to a falling input signal (i.e. a high-to-low input signal transition) and the second threshold being in response to a rising input signal (i.e. a low-to-high input signal transition). In other words, the first and the second predetermined signal level shifts may be such that the difference between the first and second threshold is minimized or at least reduced.

As may be understood, the precise degree of shifting needed to compensate for the hysteresis to a selected degree is dependent on the specifics of the circuit implementation. However, having two available predetermined shifts, and selecting which one to apply based on the signal level at the output of the slave latch, makes it possible for the hysteresis compensation circuit to compensate for the different thresholds for high-to-low and low-to-high transitions.

Since no reset phase (as in dynamic comparators) is needed, the hysteresis compensation generally does not subtract from the available clock period.

Since the compensation is typically performed at an internal node of the comparator circuit, additional capacitive loading at the input of the master latch is avoided. A related potential benefit is that several comparator circuits may be combined, for instance in a flash ADC or other multi-bit quantizers, wherein different degrees of hysteresis compensation may be applied individually to each comparator circuit. This is beneficial since different comparators may present different degrees of hysteresis, depending inter alia on process variations.

The hysteresis compensation circuit may be configured to cause the first predetermined shift or the second predetermined shift by controlling a current source or a variable impedance based on a signal level at the output of the second amplifier circuit.

The output of the first amplifier circuit may comprise a first output and a second output and the input of the second amplifier circuit may comprise a first input coupled to the first output and a second input coupled to the second output.

The hysteresis compensation circuit may be configured to cause the first predetermined shift by increasing a load current pulled from the second output, and to cause the second predetermined shift by increasing a load current pulled from the first output.

By increasing a load current pulled from the second output relative to the first output, or increasing a load current pulled from the first output relative to the second output, the hysteresis of the comparator circuit may be compensated for with a relatively small addition of circuitry.

The output of the first amplifier circuit may comprises a first output and a second output and the input of the second amplifier circuit may comprise a first input coupled to the first output and a second input coupled to the second output. The hysteresis compensation circuit may further be configured to cause the first predetermined shift by selectively connecting a current source to one of the first and second output of the first amplifier circuit and to cause the second predetermined shift by selectively connecting the current source to the other one of the first and second output.

A hysteresis compensation may be achieved with a comparably small current in relation to a drive current for the master and slave latches. Accordingly, a capacitive loading of the input of the second amplifier circuit may be limited.

The current source may be configured to inject a current or draw a current (wherein the current source may be referred to as a current sink).

The hysteresis compensation circuit may comprise a first switch and a second switch, each connected to the output of the slave latch, wherein the current source is connected to the first output of the first amplifier circuit via the second switch and to the second output of the first amplifier circuit via the first switch. This can enable hysteresis compensation to be achieved with only a small number of circuit elements. Moreover, since the current (injected or drawn) of the current source may be comparably small, the switches may be of a small size and thus limit the capacitive loading of the input of the second amplifier circuit. For instance, as a typical example, about 10% or less of capacitance may be added in a 28 nm CMOS implementation.

The first and the second predetermined shifts may be such that a switch point of the comparator circuit in response to a signal level at an input of the master latch changing from a high-to-low level, and a switch point of the comparator circuit in response to signal level at an input of the master latch changing from a low-to-high level, are the same. In other words, by means of the hysteresis compensation circuit a hysteresis compensation of such a degree may be achieved that the comparator circuit exhibits the same, or at least substantially same, threshold level in response to high-to-low and low-to-high input signals. This embodiment may be advantageous in cases where minimizing hysteresis as much as possible is more important than limiting an additional capacitive loading (albeit still relatively small) of the input of the slave latch.

The comparator circuit may further comprise a controller circuit configured to enable the first amplifier circuit and the second latch circuit during a first portion of a reference clock period, and alternatingly enable the first latch circuit and the second amplifier circuit during a second portion of a reference clock period.

The comparator circuit may thus be configured for clocked operation. Hence, the output of the comparator circuit may be static in the sense that the output signal level can be maintained for the duration of the reference clock period (i.e. between reference clock transitions of a same polarity). The output signal level might change only at each new reference clock period.

The input of the first amplifier circuit may form the input of the master latch. The output of the first amplifier circuit may form the output of the master latch. The input of the second amplifier circuit may form the input of the slave latch. The output of the second amplifier circuit may form the output of the slave latch.

The first amplifier circuit may be configured as a differential amplifier. The first amplifier circuit may comprise a first differential pair of transistors. The gates of the transistors of the first differential pair may be coupled to the input of the master latch.

The second amplifier circuit may be configured as a differential amplifier. The second amplifier circuit may comprise a second differential pair of transistors. The gates of the transistors of the second differential pair may be coupled to the input of the slave latch.

According to a second aspect there is provided a multi-bit quantizer comprising a plurality of comparator circuits according to the first aspect or any of the above described variations thereof.

BRIEF DESCRIPTION OF THE FIGURES

The above, as well as additional, features will be better understood through the following illustrative and non-limiting detailed description of example embodiments, with reference to the appended drawings.

All the figures are schematic, not necessarily to scale, and generally only show parts which are necessary to elucidate example embodiments, wherein other parts may be omitted or merely suggested.

DETAILED DESCRIPTION

Example embodiments will now be described more fully hereinafter with reference to the accompanying drawings. That which is encompassed by the claims may, however, be embodied in many different forms and should not be construed as limited to the embodiments set forth herein; rather, these embodiments are provided by way of example. Furthermore, like numbers refer to the same or similar elements or components throughout.

In the following, a comparator circuit 10 will be described which comprises a master latch 100, a slave latch 200 and a hysteresis compensation circuit 30, with reference to FIGS. 3-5. The comparator circuit 10 is generally suitable for use as a static comparator.

Figure 1:
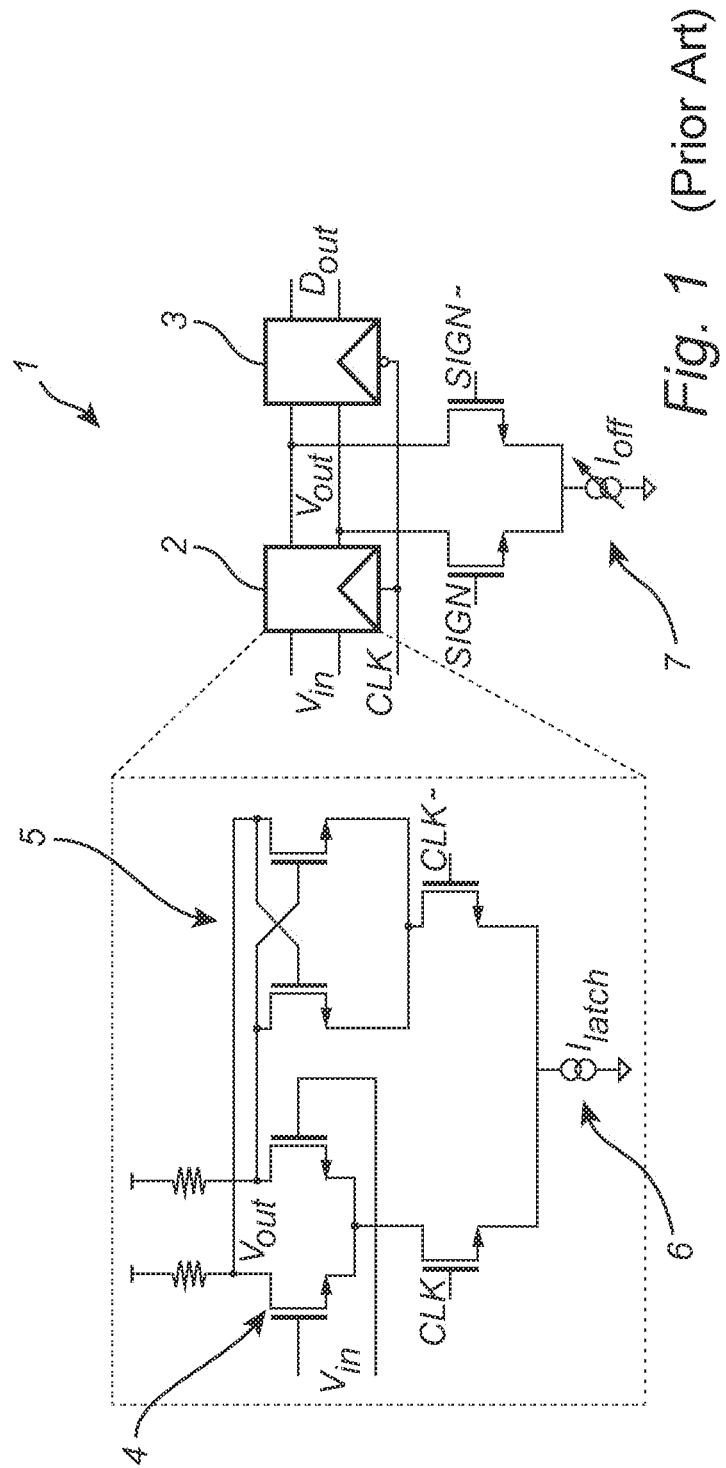
FIG. 1 is a schematic diagram of a static comparator, according to an example embodiment.
Figure 2:
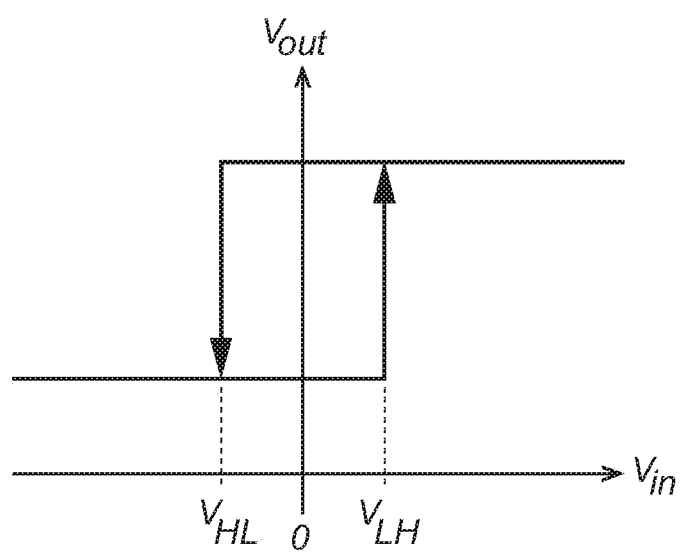
FIG. 2 is a diagram illustrating the concept of comparator hysteresis, according to an example embodiment.

A comparator circuit with a master and slave latch configuration may exhibit significant hysteresis. The concept of comparator hysteresis is schematically illustrated in FIG. 2. The ideal/desired threshold level corresponds to the $V_{IN}=0$ (i.e. the mid-point between the logic low and high level input). However, a voltage $V_{IN}=V_{LH}$ greater than the ideal threshold level is in this case needed to switch the comparator output when the input transitions from a low level to a high level. Conversely, a voltage $V_{IN}=V_{HL}$ smaller than the ideal threshold level is in this case needed to switch the comparator output when the input transitions from a high level to a low level. For a comparator circuit 10 having a master-slave latch configuration at least a portion of the hysteresis may be attributed to memory effects in the master and slave latches 100, 200.

Figure 3:
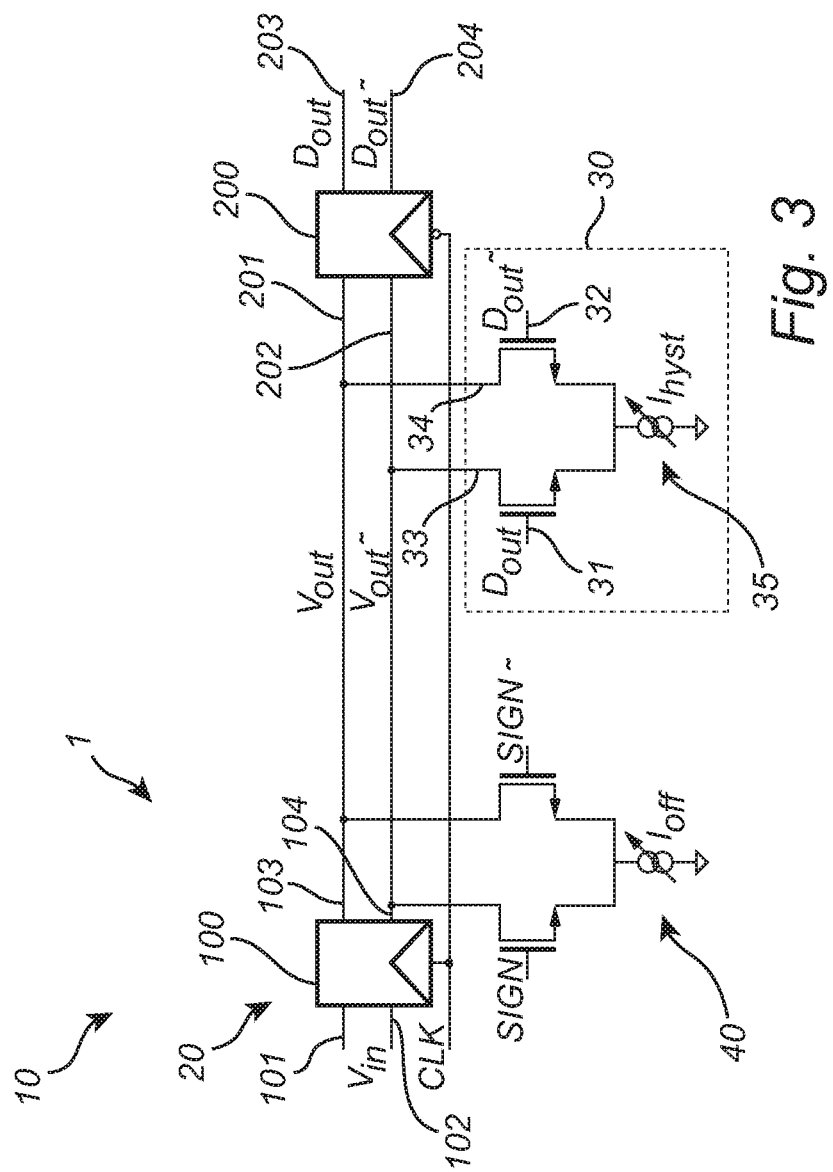
FIG. 3 is a schematic diagram of a comparator circuit comprising a hysteresis compensation circuit, according to an example embodiment.

With reference to FIG. 3, the comparator circuit 10 comprises a master latch 100. First and second inputs 101, 102 of the master latch 100 form the signal inputs of the comparator circuit 10. The comparator circuit 10 further comprises a slave latch 200. First and second inputs 201, 202 of the slave latch 200 are coupled to first and second outputs 103, 104 of the master latch 100. First and second outputs 203, 204 of the slave latch 200 form the signal outputs of the comparator circuit 10. The operation of the master and slave latch 100, 200 is controlled on basis of a complementary clock signal CLK, CLK~.

The comparator circuit 10 further comprises a hysteresis compensation circuit 30 configured to compensate for the hysteresis of the master and slave latches 100, 200, as described below.

The comparator circuit 10 may also comprises an offset compensation circuit 40. As will be appreciated by the skilled person, the offset compensation circuit 40 is statically configured by the sign (e.g., polarity) of a static bit SIGN, SIGN– and thereby provide either a positive or a negative offset at the output 103, 104 of the master latch 100.

Figure 4:
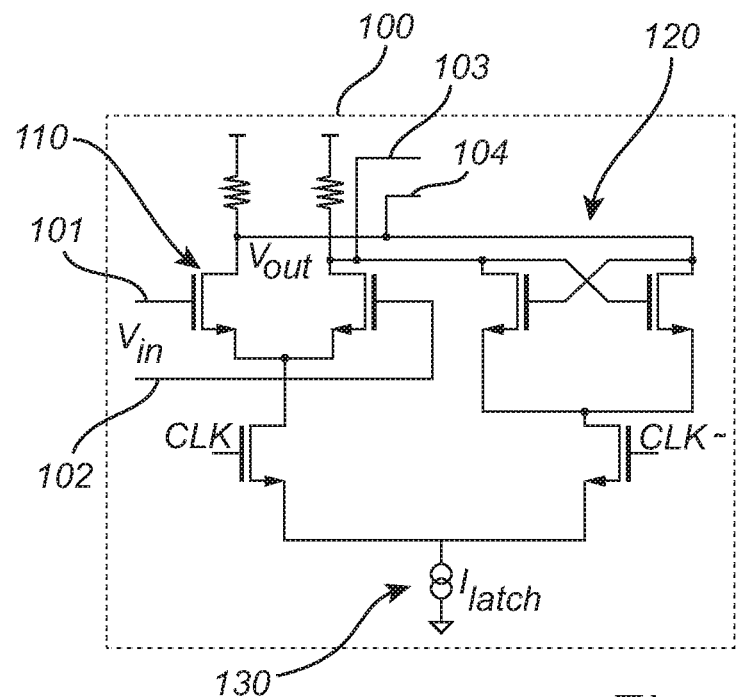
FIG. 4 shows a circuit layout of a master latch, according to an example embodiment.

FIG. 4 shows the master latch 100 in greater detail. The master latch 100 comprises a first amplifier circuit 110. The inputs 101, 102 of the first amplifier circuit 110 form the inputs of the master latch 100. The outputs 103, 104 of the first amplifier circuit 110 form the outputs of the master latch 100. The first amplifier circuit 110 forms an input amplifier or sense amplifier of the master latch 100. When enabled, the first amplifier circuit 110 is configured to sense the signal levels present at the inputs 101, 102 and provide amplified output signals at the outputs 103, 104. The first amplifier circuit 110 may be configured as a differential amplifier. The first amplifier circuit 110 may as shown comprise a differential pair of transistors, for instance field-effect transistors (FETs) such as MOSFETs or MISFETs. The pair of transistors may as shown be loaded by resistors. A first transistor of the pair is connected between the first input 101 and the second output 104. A second transistor of the pair is connected between the second input 102 and the first output 103.

The master latch 100 comprises a first latch circuit 120. The first latch circuit 120 is coupled to the outputs 103, 104 of the first amplifier circuit 110. When enabled, the first latch circuit 120 is configured to latch the signal levels present at the outputs 103, 104 of the first amplifier circuit 110. The first latch circuit 120 may as shown comprise a cross-coupled pair of transistors, for instance FETs such as MOSFETs or MISFETs. This pair of transistors is also loaded by resistors.

The first amplifier circuit 110 and the first latch circuit 120 are each coupled to a high power supply (e.g. $V_{DD}$) and a current sink 130. The current sink 130 may be implemented by a constant current source, however a resistor-based implementation is also possible. The current sink 130 is as shown coupled to the first amplifier circuit 110 and the first latch circuit 120 through a respective switch controlled on the basis of the complementary clock signals CLK, CLK~. Accordingly, when CLK is high the first amplifier circuit 110 is enabled and the first latch circuit 120 is disabled. Conversely, when CLK~ is high the first amplifier circuit 110 is disabled and first latch circuit 120 is enabled.

Figure 5:
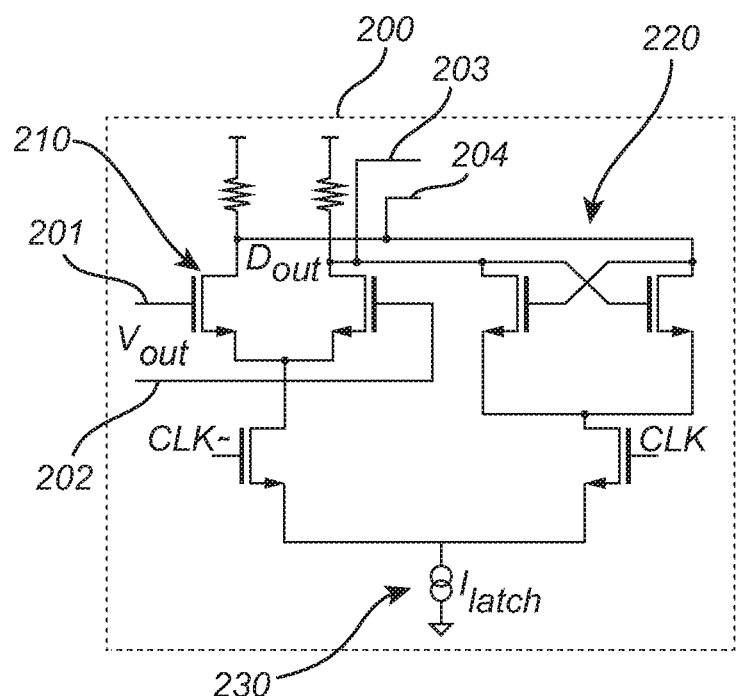
FIG. 5 shows a circuit layout of a slave latch, according to an example embodiment.

FIG. 5 shows the slave latch 200 in greater detail. The slave latch 200 has a configuration corresponding to that of the master latch 100. To avoid unnecessary repetition, only the distinguishing parts of the slave latch 200 will be discussed below.

The slave latch 200 comprises a second amplifier circuit 210. The inputs 201, 202 of the second amplifier circuit 210 form the inputs of the slave latch 200. The outputs 203, 204 of the second amplifier circuit 210 form the outputs of the slave latch 100, and accordingly the outputs of the comparator circuit 10. When enabled, the second amplifier circuit 210 is configured to sense the signal levels present at the inputs 201, 202 and provide amplified output signals at the outputs 203, 204.

The slave latch 200 comprises a second latch circuit 220 coupled to the outputs 203, 204 of the second amplifier circuit 210. When enabled, the second latch circuit 220 is configured to latch the signal levels present at the outputs 203, 204 of the second amplifier circuit 210.

The second amplifier circuit 210 and the second latch circuit 220 are each coupled to a high power/voltage supply (e.g. $V_{DD}$) and a current sink 230. The current sink 230 may be implemented by a constant current source, however a resistor-based implementation is also possible. The current sink 230 is as shown coupled to the second amplifier circuit 210 and the second latch circuit 220 through a respective switch controlled on the basis of the complementary clock signals CLK, CLK~. However, as indicated in FIG. 3, the clock input of the slave latch 200 is inverted with respect to the clock input of the master latch 100. Accordingly, when CLK is high the second amplifier circuit 210 is disabled and the second latch circuit 220 is enabled. Conversely, when CLK~ is high the second amplifier circuit 210 is enabled and the second latch circuit 220 is disabled.

The clock circuitry, the switches and the current sinks 130, 230 accordingly form part of a controller circuit configured to alternatingly: enable the first amplifier circuit 110 and the second latch circuit 220 when CLK is high, and enable the first latch circuit 120 and the second amplifier circuit 210 when CLK~ is high.

Referring again to FIG. 3, the hysteresis compensation circuit 30 is coupled to the output 203, 204 of the second amplifier circuit 210.

More specifically, the hysteresis compensation circuit 30 comprises a first switch 31 and a second switch 32, each connected to a respective one of the outputs 203, 204 of the second amplifier circuit 210. The hysteresis compensation circuit 30 further comprises a current source 35. The current source 35 may be a digitally programmable current DAC. The current drawn by the current source 35 may thus be controlled by varying a length of a control word. The current source 35 is connected to a first node between the first output 103 of the first amplifier circuit 110/the master latch 100 and the first input 201 via the second switch 32. The current source 35 is connected to a second node between the second output 104 of the first amplifier circuit 110/the master latch 100 and the second input 202 via the first switch 31. According to an embodiment, a separate first current source may instead be selectively connected to the first node and a separate second current source may be selectively connected to the second node, on the basis of the output level of the second amplifier circuit 210.

Accordingly, with reference to FIG. 3, when the output signal $D_{OUT}$ of the output 203 of the second amplifier circuit 210 is high, the current source 35 will be coupled to the second node. An increased load current may thus be drawn or pulled from the second node and hence from the second output 104.

Conversely, when the output $D_{OUT^-}$ of the output 204 of the second amplifier circuit 210 is high, the current source 35 will be coupled to the first node. An increased load current may thus be drawn or pulled from the first node and hence from the first output 103. Thus, the hysteresis compensation circuit 30 may provide one of a first and a second predetermined signal level shift at the outputs 103, 104 of the first amplifier circuit 110/master latch 100. By appropriately selecting the amount of additional load current drawn from the outputs 103, 104 the difference between the high-to-low and low-to-high thresholds/switch points of the comparator circuit (caused by the master latch 100 and the slave latch 200) may be reduced or minimized.

In the illustrated configuration, these signal level shifts are also seen at the inputs 201, 202 of the second amplifier circuit 210. More specifically, each of these shifts will be referred to the inputs 101, 102 of the first amplifier circuit 110/the master latch 100, divided by the gain of the amplifier circuit 110, thereby creating an input referred offset during the sensing phase of the master latch 100.

Embodiments have been described with reference to a limited number of examples. However, as is readily appreciated by a person skilled in the art, other examples than the ones disclosed above are possible within the scope of the disclosure.

For instance, although in the above the hysteresis compensation circuit 30 comprises a current source 35 configured to draw a current from the inputs 201, 202 of the slave latch 200, it is also possible to inject a current with an opposite polarity to the nodes, such that the first and second predetermined signal level shifts are achieved. It is also possible to replace the current source 35 with an appropriately selected resistance, such that a desired current may be drawn from the outputs 103, 104. According to a further variation, the predetermined single level shifts may be achieved by the hysteresis compensation circuit controlling variable impedances connected between the master and slave latches 100, 200. According to yet another variation the hysteresis compensation could instead be achieved by controlling the body (or bulk) voltages of the differential input of the first amplifier circuit 110 in a complementary fashion, thereby shifting the levels such that the hysteresis may be compensated for.

While some embodiments have been illustrated and described in detail in the appended drawings and the foregoing description, such illustration and description are to be considered illustrative and not restrictive. Other variations to the disclosed embodiments can be understood and effected in practicing the claims, from a study of the drawings, the disclosure, and the appended claims. The mere fact that certain measures or features are recited in mutually different dependent claims does not indicate that a combination of these measures or features cannot be used. Any reference signs in the claims should not be construed as limiting the scope.

What is claimed is:

1. A comparator circuit comprising:
a master latch comprising a first amplifier circuit and a first latch circuit coupled to a first output of the first amplifier circuit;
a slave latch comprising a second amplifier circuit having an input coupled to the first output and a second latch circuit coupled to a second output of the second amplifier circuit; and
a hysteresis compensation circuit coupled to the second output and configured to cause a first predetermined shift of the first output in response to a high signal level of the second output and configured to cause a second predetermined shift of the first output in response to a low signal level of the second output,
wherein the hysteresis compensation circuit is configured such that a first input signal level applied to an input of the first amplifier circuit that causes the second output to transition from logic high to logic low is substantially equal to a second input signal level applied to the input of the first amplifier circuit that causes the second output to transition from logic low to logic high.

2. The comparator circuit according to claim 1, wherein the hysteresis compensation circuit is configured to cause the first predetermined shift or the second predetermined shift by controlling a current source or a variable impedance based on a signal level of the second output.

3. The comparator circuit according to claim 1, wherein the first output comprises a first output terminal and a second output terminal and the input comprises a first input terminal coupled to the first output terminal and a second input terminal coupled to the second output terminal, and wherein the hysteresis compensation circuit is configured to cause the first predetermined shift by increasing a load current pulled from the second output terminal and to cause the second predetermined shift by increasing a load current pulled from the first output terminal.

4. The comparator circuit according to claim 1, wherein the first output comprises a first output terminal and a second output terminal and the input comprises a first input terminal coupled to the first output terminal and a second input terminal coupled to the second output terminal, and wherein the hysteresis compensation circuit is configured to cause the first predetermined shift by selectively connecting a current source to one of the first output terminal or the second output terminal and to cause the second predetermined shift by selectively connecting the current source to the other terminal of the first output terminal and the second output terminal.

5. The comparator circuit according to claim 4, wherein the hysteresis compensation circuit comprises a first switch and a second switch each connected to the second output, wherein the current source is connected to the first output terminal via the second switch and to the second output terminal via the first switch.

6. The comparator circuit according to claim 1, wherein the first predetermined shift and the second predetermined shift are such that a first switch point of the comparator circuit corresponding to signal level at an input of the master latch changing from a high-to-low level is equal to a second switch point of the comparator circuit corresponding to signal level at the input of the master latch changing from a low-to-high level.

7. The comparator circuit according to claim 1, further comprising a controller circuit configured to alternatingly: enable the first amplifier circuit and the second latch circuit during a first portion of a reference clock period, and enable the first latch circuit and the second amplifier circuit during a second portion of the reference clock period.

8. The comparator circuit according to claim 1, wherein the first amplifier circuit and the second amplifier circuit each comprises a differential pair of transistors.

9. A multi-bit quantizer comprising a plurality of comparator circuits according to claim 1.

10. A method of operating the comparator circuit of claim 1, the method comprising:
causing the first predetermined shift in response to the high signal level of the second output; or
causing the second predetermined shift in response to the low signal level of the second output.

11. The method according to claim 10, wherein causing the first predetermined shift or the second predetermined shift comprises controlling a current source or a variable impedance based on a signal level of the second output.

12. The method according to claim 10, wherein the first output comprises a first output terminal and a second output terminal and the input comprises a first input terminal coupled to the first output terminal and a second input terminal coupled to the second output terminal, and wherein causing the first predetermined shift comprises increasing a load current pulled from the second output terminal and wherein causing the second predetermined shift comprises increasing a load current pulled from the first output terminal.

13. The method according to claim 10, wherein the first output comprises a first output terminal and a second output terminal and the input comprises a first input terminal coupled to the first output terminal and a second input terminal coupled to the second output terminal, and wherein causing the first predetermined shift comprises selectively connecting a current source to one of the first output terminal or the second output terminal and wherein causing the second predetermined shift comprises selectively connecting the current source to the other terminal of the first output terminal and the second output terminal.

14. The method according to claim 10, wherein the first predetermined shift and the second predetermined shift are such that a first switch point of the comparator circuit corresponding to signal level at an input of the master latch changing from a high-to-low level is equal to a second switch point of the comparator circuit corresponding to signal level at the input of the master latch changing from a low-to-high level.

15. The method according to claim 10, further comprising alternatingly: enabling the first amplifier circuit and the second latch circuit during a first portion of a reference clock period, and enabling the first latch circuit and the second amplifier circuit during a second portion of the reference clock period.

16. The comparator circuit of claim 1, wherein the first input signal level is equal to the second input signal level.

* * * * *